US007289370B2

(12) United States Patent
Adams et al.

(10) Patent No.: US 7,289,370 B2
(45) Date of Patent: Oct. 30, 2007

(54) METHODS AND APPARATUS FOR ACCESSING MEMORY

(75) Inventors: Chad Allen Adams, Byron, MN (US); Anthony Gus Aipperspach, Rochester, MN (US); Juergen Pille, Stuttgart (DE); Otto Wagner, Altdorf (DE)

(73) Assignee: International Business Machines Corporation, Armonk, NY (US)

( * ) Notice: Subject to any disclaimer, the term of this patent is extended or adjusted under 35 U.S.C. 154(b) by 1 day.

(21) Appl. No.: 11/186,606

(22) Filed: Jul. 21, 2005

(65) Prior Publication Data

US 2007/0019461 A1 Jan. 25, 2007

(51) Int. Cl.
*G11C 16/04* (2006.01)
(52) U.S. Cl. ............. 365/189.01; 365/203; 365/189.11
(58) Field of Classification Search ................ 365/154, 365/203, 189.01, 189.11
See application file for complete search history.

(56) References Cited

U.S. PATENT DOCUMENTS

| 6,442,087 | B1 * | 8/2002 | Morishima ................... 365/203 |
| 7,054,217 | B2 * | 5/2006 | Yamada ................. 365/230.05 |
| 2005/0007813 | A1 | 1/2005 | Adams et al. |

* cited by examiner

*Primary Examiner*—David Lam
(74) *Attorney, Agent, or Firm*—Dugan & Dugan PC (57) ABSTRACT

In a first aspect, a first method is provided for accessing memory. The first method includes the steps of (1) storing a bit in a cell included in a memory having a plurality of cells arranged into rows and columns, wherein each cell includes a group of transistors adapted to both store the bit and affect a signal asserted during a read operation on a bit line coupled to the cell such that the affected signal matches a value of the bit stored in the cell; and (2) preventing the value of the bit stored in the cell from changing state while the group of transistors affects the signal asserted during the read operation on the bit line coupled to the cell. Numerous other aspects are provided.

16 Claims, 5 Drawing Sheets

METHODS AND APPARATUS FOR ACCESSING MEMORY

FIELD OF THE INVENTION

The present invention relates generally to computer systems, and more particularly to methods and apparatus for accessing memory in a computer system.

BACKGROUND

A memory may include a plurality of SCRAM cells arranged in columns and rows. Each SRAM cell may store a bit of data. To read a value stored in a cell or write a value into a cell, a column including the cell may be selected, and thereafter, a row including the cell may be selected.

An SRAM cell of a conventional memory may include transistors employed to store a value in the cell. The transistors may also be employed to affect a state of a signal coupled to the cell when a column that includes the cell is selected, such as for a read operation (e.g., the transistors may pull down the signal from a high logic state to a low logic state). However, employing such transistors to affect the state of the signal places stress on the cell which may cause the value stored in the cell to inadvertently change state (e.g., to be disturbed). Accordingly, improved methods and apparatus for accessing memory are desired.

SUMMARY OF THE INVENTION

In a first aspect of the invention, a first method is provided for accessing memory. The first method includes the steps of (1) storing a bit in a cell included in a memory having a plurality of cells arranged into rows and columns, wherein each cell includes a group of transistors adapted to both store the bit and affect a signal asserted during a read operation on a bit line coupled to the cell such that the affected signal matches a value of the bit stored in the cell; and (2) preventing the value of the bit stored in the cell from changing state while the group of transistors affects the signal asserted during the read operation on the bit line coupled to the cell.

In a second aspect of the invention, a first apparatus for accessing memory including a plurality of cells, a subset of which includes at least a first cell coupled to a first set of bit lines and at least a second cell coupled to a second set of bit lines, is provided. The first apparatus includes (1) first logic adapted to couple to the subset of cells included in the memory and adapted to write data to a selected cell in the subset of cells; and (2) second logic adapted to couple to the subset of cells and adapted to read data from a selected cell in the subset of cells such that a value of a bit stored in the selected cell is prevented from changing state while reading data from the selected cell.

In a third aspect of the invention, a first system for accessing memory is provided. The system includes (1) a memory having a plurality of cells arranged into rows and columns, wherein each cell includes a group of transistors adapted to both store the bit and affect a signal asserted during a read operation on a bit line coupled to the cell such that the affected signal matches a value of the bit stored in the cell, wherein the memory is adapted to prevent the value of the bit stored in the cell from changing state while the group of transistors affects the signal asserted during the read operation on the bit line coupled to the cell; and (2) logic coupled to the memory and adapted to perform the read operation on the cell. Numerous other aspects are provided in accordance with these and other aspects of the invention.

Other features and aspects of the present invention will become more fully apparent from the following detailed description, the appended claims and the accompanying drawings.

DETAILED DESCRIPTION

The present invention provides methods and apparatus for preventing a value stored in an SRAM cell of a memory from inadvertently changing state during a read operation. For example, the present invention provides evaluation logic adapted to perform a read and/or write operation on a selected cell in the memory without causing cells (e.g., the selected cell or remaining cells) of the memory from inadvertently changing state. More specifically, the present invention may reduce a load (e.g., a number of cells) coupled to one or more bit lines, each of which is adapted to provide signals to cells coupled thereto, of the memory by employing a plurality of local bit lines rather than a continuous bit line. By reducing the load coupled to a bit line, the present invention may reduce an amount of time that a cell coupled thereto undergoes the above-described stress during a read and/or write operation. Consequently, the present invention may prevent a value stored in such cell from inadvertently changing state during a read operation. Inventive evaluation logic and methods of using the same are also provided.

Figure 1:
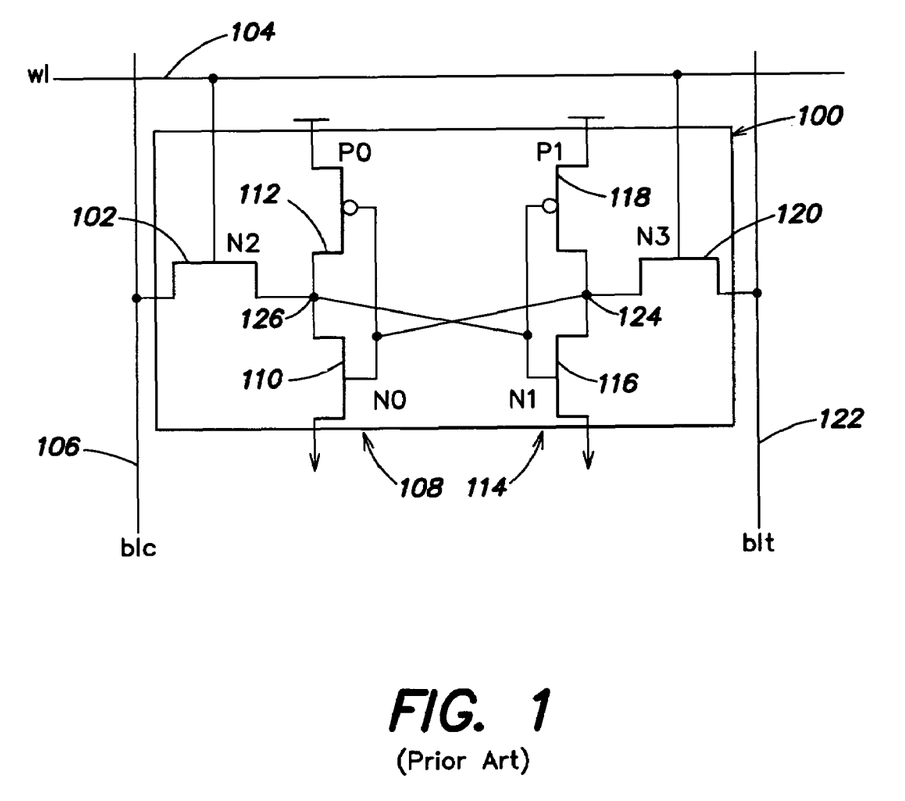
FIG. 1 illustrates a conventional SRAM cell.

FIG. 1 illustrates a conventional SRAM cell. With reference to FIG. 1, the conventional SRAM cell 100 may include six transistors. For example, the conventional SRAM cell 100 includes a first transistor 102 (e.g., an NFET) coupled (e.g., via a gate terminal) to a word line 104 such that the word line 104 may serve to activate the first transistor 102. The first transistor 102 may be coupled (e.g., via a drain or source terminal) to a first bit line 106 (e.g., Bit Line Complement (BLC)), to an input of a first logic device 108, such as a first inverter formed by a second transistor (e.g., an NFET) 110 and third transistor (e.g., a PFET) 112, and to an output of a second logic device 114, such as a second inverter formed by a fourth transistor (e.g., an NFET) 116 and fifth transistor (e.g., a PFET) 118 via a source or drain terminal of the first transistor 102. Other types of transistors and/or logic devices may be used.

The conventional SRAM cell 100 may include a sixth transistor 120 (e.g., an NFET), coupled (e.g., via a gate terminal) to the word line 104 such that the word line 104 may serve to activate the sixth transistor 120. The sixth transistor 120 may be coupled (e.g., via a source or drain terminal) to a second bit line 122 (e.g., Bit Line True (BLT)), to an output of the first logic device 108, such as the first inverter, and to an input of the second logic device 114, such as the second inverter (e.g., via a drain or source terminal of the sixth transistor 120). The node 124 at the input of the second logic device 114 and the output of the first logic device 108 may serve as a value stored in the cell 100. Alternatively, the node 126 at the input of the first logic device 108 and the output of the second logic device 114 may serve as the value stored in the cell 100.

In some embodiments, before a read or write operation is performed on the cell 100, signals of a high floating logic state may be asserted on the first and/or second bit lines 106, 122. Therefore, to read a value of a high logic state from the cell 100, the first and second transistors 102, 110 of the cell 100 must affect the state of the signal asserted on the first bit line 106 (e.g., pull down the signal of a high logic state to a low logic state). However, affecting the signal on the first bit line 106 in this manner may cause the value at a node 126 of the cell 100 to elevate. If such value elevates above a switching voltage of the first logic device 108, the value stored in the cell 100 may inadvertently switch state during the read operation. The switching voltage of the first logic device 108 may be based on design parameters of the second and third transistors 110, 112.

Similarly, to read a value of a low logic state from the cell 100, the fourth and sixth transistors 116, 120 of the cell 100 must affect the state of the signal asserted on the second bit line 122 (e.g., pull down the signal of a high logic state to a low logic state). However, affecting the signal on the second bit line 122 in this manner may cause the value at a node 124 of the cell 100 to elevate. If such value elevates above a switching voltage of the second logic device 114, the value stored in the cell 100 may inadvertently switch state during the read operation. The switching voltage of the second logic device 114 may be based on design parameters of the fourth and fifth transistors 116, 118. Consequently, improved methods and apparatus are desired for accessing memory including such cells 100.

Figure 2:
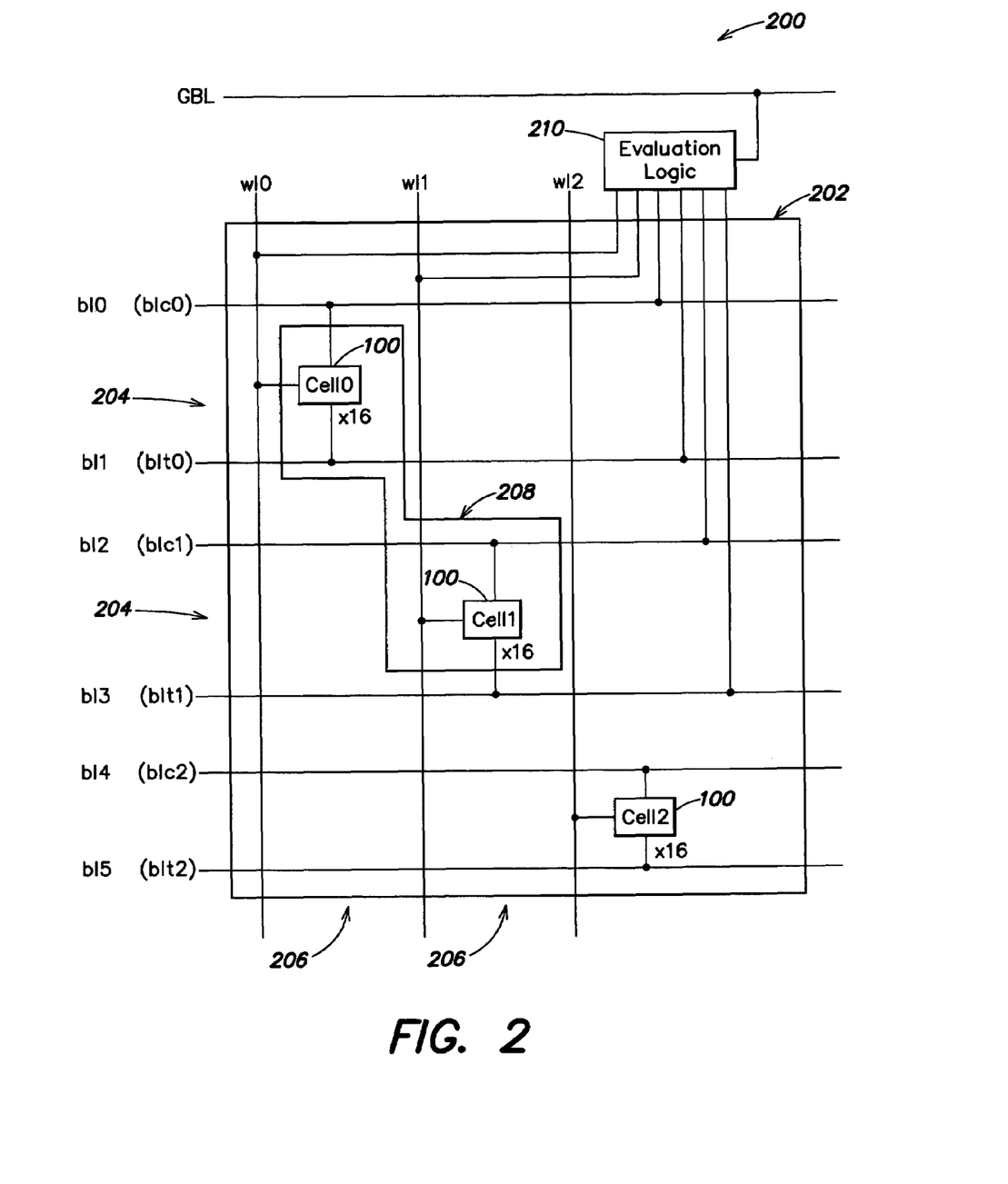
FIG. 2 is a block diagram of a system for accessing memory in accordance with an embodiment of the present invention.

FIG. 2 is a block diagram of a system for accessing memory in accordance with an embodiment of the present invention. With reference to FIG. 2, the system 200 may include memory 202 having a plurality of conventional SRAM cells 100 (described with reference to FIG. 1) arranged into rows 204 and columns 206. A subset 208 of the plurality of cells 100 may include at least one cell coupled to a first set of bit lines and at least one cell coupled to a second set of bit lines. For example, the subset 208 of the plurality of cells 100 may include at least a first cell (cell 0) coupled to a first bit line bl0 and a second bit line bl1. The first bit line bl0 may serve as a Bit Line Complement (BLC) (e.g., blc0) for the first cell (cell 0) and the second bit line bl1 may serve as a Bit Line True (BLT) (e.g., blt0) for the first cell cell 0. The first cell (cell 0) may be coupled to a first word line wl0. Further, the subset 208 of the plurality of cells 100 may include at least a second cell (cell 1) coupled to a third bit line bl2 and a fourth bit line bl3. The third bit line bl2 may serve as a BLC (e.g., blc1) for the second cell (cell 1) and the fourth bit line bl3 may serve as a BLT (e.g., blt1) for the second cell (cell 1). The second cell (cell 1) may be coupled to a second word line wl1.

Additionally, the memory 202 may at least a third cell (cell 2) not included in the subset 208 of the plurality of cells 100. The third cell (cell 2) may be coupled to a fifth bit line bl4 serving as a BLC (e.g., blc2) for the third cell (cell 2) and a sixth bit line bl5 serving as a BLT (e.g., blt2) for the third cell (cell 2). Further, the third cell (cell 2) may be coupled to a third word line wl2.

Therefore, in contrast to conventional memories, cells 100 of the memory 202 are not coupled to a continuous bit line (e.g., single bit line). In this manner, a number of cells 100 coupled to a bit line bl0-bl5 of the memory 202 may be reduced (compared to conventional memories). It should be noted that cells 100 of the memory 202 may be arranged in a domino arrangement. For example, in one embodiment, each cell 100 of the memory 202 may represent sixteen cells 100. In such embodiments, each word line wl0, wl1 may represent sixteen word lines coupled to the sixteen cells 100, respectively. However, the cells 100 of the memory 202 may be arranged in a different manner. For example, each cell 100 may represent a larger or smaller number of cells. Notwithstanding, the number of cells 100 coupled to a bit line bl0-bl5 of the memory 202 may still be reduced (compared to conventional memories).

Reducing the number cells 100 coupled to a bit line bl0-bl5 enables a cell 100 coupled thereto to affect the state of a signal asserted on the bit line bl0-bl5 more easily. For example, reducing the number of cells 100 coupled to the bit line bl0-bl5 may reduce a time required by the cell 100 to affect the state of the signal asserted on the bit line bl0-bl5. More specifically, reducing the number of cells 100 coupled to a bit line bl0-bl5 may reduce a capacitance on the bit line bl0-bl5. Consequently, a current that flows through the cell 100 and/or a period of time that said current flows through the cell 100 may be reduced (compared to conventional systems). As current flows through the cell 100, a value (e.g., voltage) at a node 124, 126 of the cell (e.g., cell 0 or cell 1) may elevate. Therefore, an amount of time that the value at a node 124, 126 of the cell (e.g., cell 0 or cell 1) is forced to the elevated state may be reduced. Consequently, a chance that the elevated voltage at the node 124, 126 exceeds a switching voltage of an inverter 108, 114 included in the cell (e.g., cell 0 or cell 1) may be reduced.

The system 200 may include evaluation logic 210 coupled to the memory. More specifically, respective evaluation logic 210 may be coupled to subsets 208 of the memory 202, and therefore, the evaluation logic 210 may be local to a subset 208. The evaluation logic 210 may be adapted to read data from a cell (e.g., cell 0 and/or cell 1 of the subset 208) in the memory 202 such that the value of a bit stored in the cell is prevented from changing state while a group of transistors in the cell affects the signal asserted during the read operation on a bit line coupled to the cell. Additionally, the evaluation logic 210 may write data to a cell of the memory 202 (e.g., cell 0 and/or cell 1 of the subset 208). Further, the evaluation logic 210 may establish a voltage of signals asserted on (e.g., pre-charge) one or more bit lines bl0-bl3 coupled to cells cell 0, cell 1 in the subset 208 before reading data from and/or writing data to a cell (e.g., cell 0 or cell 1). Details of first exemplary evaluation logic in accordance with an embodiment of the present invention are described below with reference to FIGS. 3 and 4, and details of second exemplary evaluation logic in accordance with an embodiment of the present invention are described below with reference to FIGS. 5 and 6.

Figure 3:
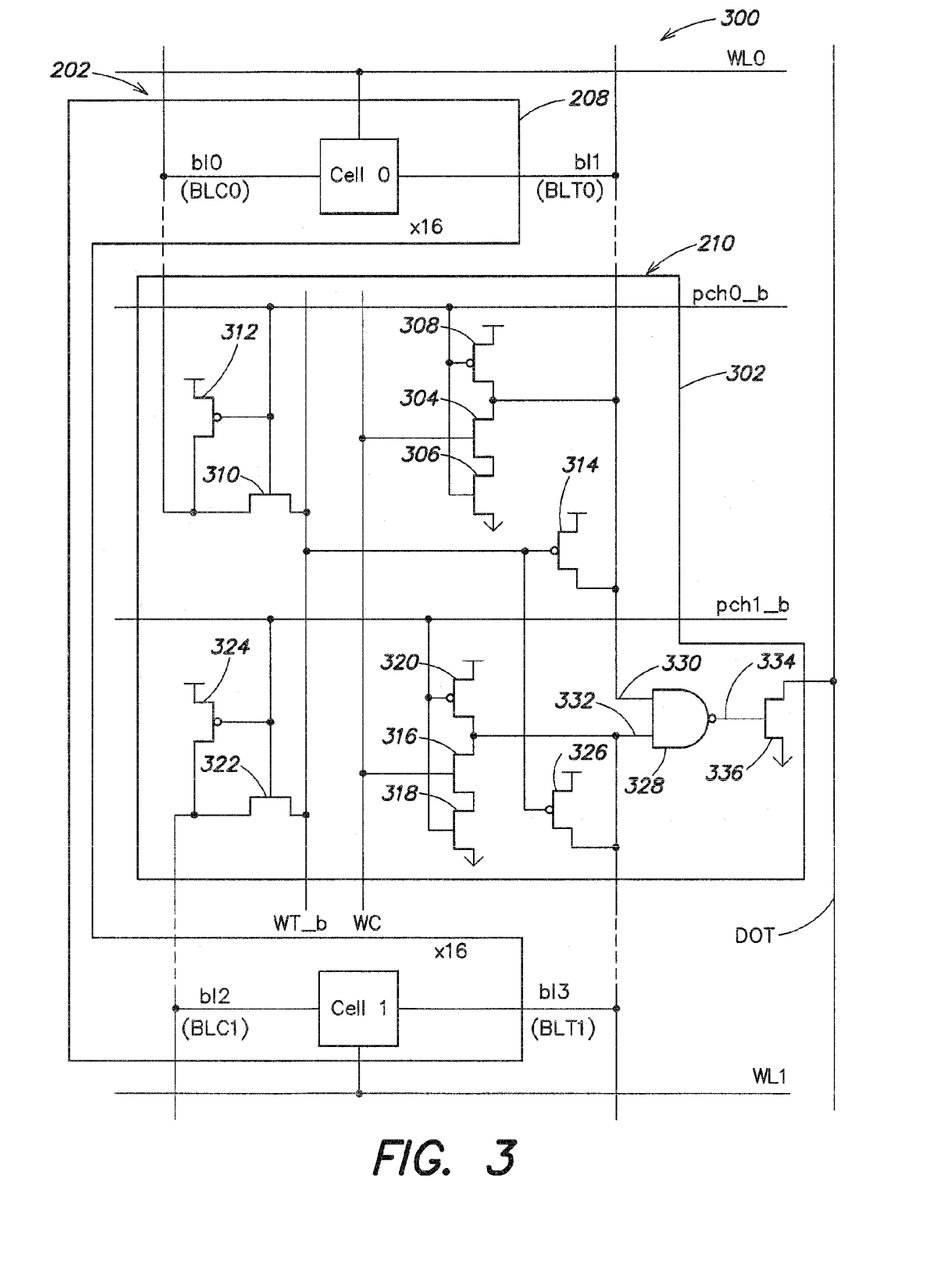
FIG. 3 illustrates first exemplary evaluation logic that may be included in the system for accessing memory in accordance with an embodiment of the present invention.
Figure 4:
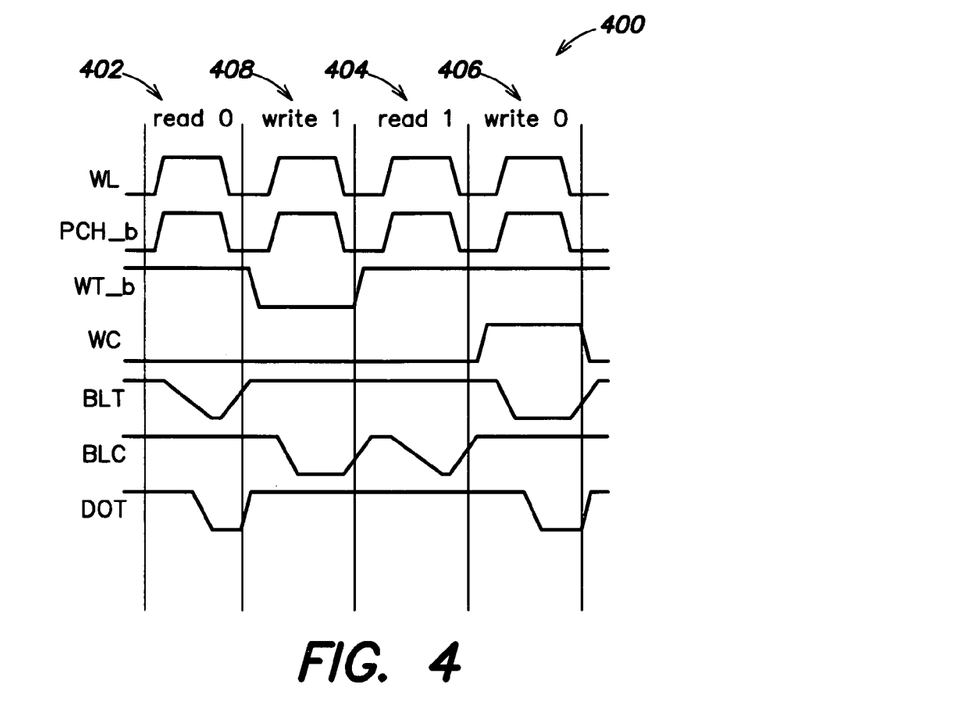
FIG. 4 is a timing diagram illustrating signals applied to the system for accessing memory including the first exemplary evaluation logic in accordance with an embodiment of the present invention.

FIG. 3 illustrates first exemplary evaluation logic that may be included in the system for accessing memory in accordance with an embodiment of the present invention and FIG. 4 is a timing diagram illustrating signals applied to the system for accessing memory including the first exemplary evaluation logic in accordance with an embodiment of the present invention. With reference to FIGS. 3 and 4, the system 300 may include the first exemplary evaluation logic 302 coupled to a portion of the memory 202. More specifically, the first exemplary evaluation logic 302 may be coupled to a subset 208 of the plurality of cells 100 included in the memory 202.

The first exemplary evaluation logic 302 may include a first transistor 304 (e.g., an NFET) coupled (e.g., via a gate terminal) to a first write line WC. The first transistor 304 may be coupled (e.g., via a source or drain terminal) to a second transistor 306 such as an NFET (e.g., to a drain or source terminal of the second transistor 306). Further, the second transistor 306 may be coupled (e.g., via a source or drain terminal) to a low logic state (e.g., ground). The second transistor 306 may be coupled (e.g., via a gate terminal) to a first pre-charge line pch0_b. Additionally, the first transistor 304 may be coupled (e.g., via a drain or source terminal) the second bit line bl1 which serves as BLT for a cell (cell 0) of the subset 208. A third transistor 308 may be coupled (e.g., via a source or drain terminal to the second bit line bl1. The third transistor 308 may be coupled (e.g., via a drain or source terminal) to a high logic state (e.g., $V_{DD}$). Further, the third transistor 308 may be coupled (e.g., via a gate terminal) to the first pre-charge line pch0_b.

The first exemplary evaluation logic 302 may include a fourth transistor 310 (e.g., an NFET) coupled (e.g., via a gate terminal) to the first pre-charge line pch0_b. The fourth transistor 310 may couple (e.g., via a source or drain terminal) to a second write line WT_b. The fourth transistor 310 may couple (e.g., via a drain or source terminal) to the first bit line bl0 which serves as the BLC for a cell (cell 0) of the subset 208. Further, the first exemplary evaluation logic 302 may include a fifth transistor 312, such as a PFET, coupled (e.g., via a source or drain terminal) to the first bit line bl0. The fifth transistor 312 may couple (e.g., via a gate terminal) to the first pre-charge line pch0_b. Further, the fifth transistor 312 may couple (e.g., via a drain or source terminal) to a high logic state such as $V_{DD}$.

The first exemplary evaluation logic 302 may include a sixth transistor 314 (e.g., a PFET) coupled (e.g., via a gate terminal) to the second write line WT_b. The sixth transistor 314 may be coupled (e.g., via a source or drain terminal) to the second bit line bl1 which serves as the BLT for the cell cell 0. Further, the sixth transistor 314 may be coupled (e.g., via a drain or source terminal) to a high logic state such as $V_{DD}$.

Additionally, the first exemplary evaluation logic 302 may include a seventh transistor 316 (e.g., an NFET) coupled (e.g., via a gate terminal) to the first write line WC. The seventh transistor 316 may be coupled (e.g., via a source or drain terminal) to an eighth transistor 318 such as an NFET (e.g., via a source or drain terminal of the eighth transistor 318). The eighth transistor 318 may be coupled (e.g., via a source or drain terminal) to a low logic state (e.g., ground). Further, the eighth transistor 318 may be coupled (e.g., via a gate terminal) to a second pre-charge line pch1_b.

Additionally, the seventh transistor 316 may be coupled (e.g., via a drain or source terminal) to the fourth bit line bl3 which serves as BLT for a cell (cell 1) of the subset 208. Similarly, a ninth transistor 320 may be coupled (e.g., via a source or drain terminal) to the fourth bit line bl3. The ninth transistor 320 may be coupled (e.g., via a drain or source terminal) to a high logic state. Further, the ninth transistor 320 may be coupled (e.g., via a gate terminal) to the second pre-charge line pch1_b.

The first exemplary evaluation logic 302 may include a tenth transistor 322 (e.g., an NFET) coupled (e.g., via a gate terminal) to the second pre-charge line pch1_b. The tenth transistor 322 may couple (e.g., via a source or drain terminal) to the second write line WT_b. The tenth transistor 322 may couple (e.g., via a drain or source terminal) to the third bit line bl2 which serves as the BLC for a cell (cell 1) of the subset 208. Similarly, an eleventh transistor 324 such as a PFET may couple (e.g., via a source or drain terminal) to the third bit line bl2. The eleventh transistor 324 may couple (e.g., via a gate terminal) to the second pre-charge line pch1_b. Further, the eleventh transistor 324 may couple (e.g., via a drain or source terminal) to a high logic state such as $V_{DD}$.

The first exemplary evaluation logic 302 may include a twelfth transistor 326 (e.g., a PFET) coupled (e.g., via a gate terminal) to the second write line WT_b. The twelfth transistor 326 may be coupled (e.g., via a source or drain terminal) to a fourth bit line bl3. Further, the twelfth transistor 326 may be coupled (e.g., via a drain or source terminal) to a high logic state such as $V_{DD}$.

The first exemplary evaluation logic may include logic 328, such as a NAND gate or the like, a first input 330 of which may be coupled to the second bit line bl1 and a second input 332 of which may be coupled to the fourth bit line bl3. An output 334 of the logic 328 may be coupled to a thirteenth transistor 336 (e.g., to a gate terminal of the thirteenth transistor 336). The thirteenth transistor 336 may be coupled (e.g., via a source or drain terminal) to a low logic state (e.g., ground). Further, the thirteenth transistor 336 may be coupled (e.g., via a drain or source terminal) to a global bit line DOT. The first exemplary evaluation logic 302 may be adapted to affect the value of a signal asserted on the global bit line DOT such that said signal tracks the value of data read from a cell cell0, cell 1 of the subset 208.

A specific arrangement of logic included in the first exemplary evaluation logic 302 is described above. However, the first exemplary evaluation logic 302 may include a larger or smaller amount of logic and/or different logic. Additionally or alternatively, logic included in the first exemplary logic 302 may be arranged differently.

The operation of the first exemplary evaluation logic 302 is now described. A signal of a high logic state may be asserted on all true and complementary bit lines bl0-bl3 coupled to cells cell 0, cell 1 of the subset 208 before reading data from and/or writing data to a cell (e.g., cell 0 or cell 1). The timing diagram 400 illustrates signals applied to the first exemplary evaluation logic 302 to read data from and/or write data to a cell (e.g., cell 0 or cell 1) of the subset 208. For example, a first portion 402 of the timing diagram 400 illustrates signals applied to and/or coupled to the first exemplary evaluation logic 302 when a value of a low logic state (e.g., logic "0") is read from a cell (e.g., cell 0 or cell 1), and a second portion 404 of the timing diagram 400 illustrates signals applied to and/or coupled to the first exemplary evaluation logic 302 when a value of a high logic state (e.g., a logic "1") is read from a cell (e.g., cell 0 or cell 1). Similarly, a third portion 406 of the timing diagram 400 illustrates signals applied to and/or coupled to the first exemplary evaluation logic 302 when a value of a low logic state is written to a cell (e.g., cell 0 or cell 1), and a fourth portion 408 of the timing diagram 400 illustrates signals applied to and/or coupled to the first exemplary evaluation logic 302 when a value of a high logic state is written to a cell (e.g., cell 0 or cell 1). One or more of the signals illustrated in the timing diagram 400 may be based on a clock having a 50% duty factor (although the clock may have a larger or smaller duty factor).

Signals BLC and BLT refer generally to signals asserted on the Bit Line Complementary and Bit Line True, respectively, of a cell to be read from and/or a cell to be written to. Similarly, signal WL refers to a signal asserted on a word line wl0, wl1 coupled to the cell (e.g., cell 0 or cell 1) to be read from and/or the cell to be written to. Further, signal PCH_b refers to a signal asserted on a pre-charge line pch0_b, pch1_b coupled to bit lines bl0-bl1, bl2-bl3 of a cell (e.g., cell 0 or cell 1) to be read from and/or written to. For example, if cell 0 is being read from and/or written to, PCH_b refers to a signal asserted on the first pre-charge line pch0_b. Similarly, if cell 1 is being read from and/or written to, PCH_b refers to a signal asserted on the second pre-charge line pch1_b.

Read "0"

While reading a value of a low logic state (e.g., a logic "0") from a node 124 of cell 0, it is assumed a signal of a high logic state is asserted on the second input 332 of the logic 328 (e.g., NAND gate). Further, it is assumed a signal of a high logic state is asserted on the global bit line DOT before reading data from the cell cell 0.

To read a value of a low logic state from a node 124 of cell 0, signals illustrated by the first portion 402 of the timing diagram 400 may be applied to and/or coupled to the first exemplary evaluation logic 302. Consequently, the third transistor 308 may be employed to establish a signal of a high floating logic state on the second bit line bl1. Similarly, the fifth transistor 312 may be employed to establish a signal of a high logic state (e.g., $V_{DD}$-Vt, where Vt is the threshold voltage of the fifth transistor 312) on the first bit line bl0. Consequently, a signal of a high logic state is asserted on the first input 330 of the logic 328. Further, the fourth transistor 310 may maintain the voltage (e.g., $V_{DD}$-Vt) on the first bit line bl0.

While reading the value of a low logic state from the node 124 of cell 0, the fourth and sixth transistors 116, 120 of the cell (cell 0) may affect the value of the signal asserted on the second bit line bl1 such that said signal changes from a high logic state to a low logic state. While affecting the value of said signal, the value of a voltage at the node 124 may elevate. However, the present methods and apparatus may prevent the elevated voltage from exceeding a switch point of an inverter (e.g., the second inverter 114) included in the cell (cell 0) (e.g., by reducing a time that the voltage at the node 124 is elevated). Because the cell (cell 0) changes the value asserted on the second bit line bl1 to a low logic state, the value asserted on the first input 330 of the logic 328 changes to a low logic state. Therefore, a signal of a high logic state is asserted on the output 334 of the logic 328. The signal asserted on the output 334 may serve to activate the thirteenth transistor 336. Consequently, the first exemplary evaluation logic 302 (e.g., the thirteenth transistor 336 of the first exemplary evaluation logic 302) may affect the value of the signal asserted on the global bit line DOT such that said signal changes from a high logic state to a low logic state. In this manner, the first exemplary evaluation circuit 302 may cause the global bit line DOT to track the value stored in a node 124 of the cell cell 0.

Because a number of cells 100 coupled to the first and second bit lines bl0, bl1 is reduced compared to conventional memories, the cell 0 may prevent the value (e.g., voltage) at the node 124 from changing state while changing the signal asserted on the second bit line bl1 in the manner described above. For example, because the number of cells 100 coupled to the first and second bit lines bl0, bl1 is reduced compared to conventional memories, an amount of a time that voltage at the node 124 is elevated may be reduced.

Read "1"

While reading a value of a high logic state (e.g., a logic "1") from a node 124 of cell 0, it is assumed a signal of a high logic state is asserted on the second input 332 of the logic 328 (e.g., NAND gate). Further, as stated, it is assumed a signal of a high logic state is asserted on the global bit line DOT before reading data from the cell cell 0.

To read a value of a high logic state from a node 124 of cell 0, signals illustrated by the second portion 402 of the timing diagram 400 may be applied to and/or coupled to the first exemplary evaluation logic 302. Consequently, the third transistor 308 may be employed to establish a signal of a floating high logic state on the second bit line bl1. Similarly, the fifth transistor 312 may be employed to establish a signal of a high logic state (e.g., $V_{DD}$-Vt, where Vt is the threshold voltage of the fifth transistor 312) on the first bit line bl0. Consequently, a signal of a high logic state may be asserted on the first input 330 of the logic 328.

However, while reading the value of a high logic state from the node 124 of cell 0, the first and second transistors 102, 110 of the cell (cell 0) may affect the value of the signal asserted on the first bit line bl0 such that said signal changes from a high logic state to a low logic state. While affecting the value of said signal, the value of a voltage at a node 126 of the cell (cell 0) may elevate. However, the present methods and apparatus may prevent the elevated voltage from exceeding a switch point of an inverter (e.g., the first inverter) 108 included in the cell (cell 0) (e.g., by reducing a time that the voltage at the node 126 is elevated). Therefore, the elevated voltage at the node 126 remains of a low logic state and a value of a voltage at the node 124 of the cell (cell 0) remains of a high logic state. Consequently, the signal asserted on the second bit line bl1 remains of a high logic state, and therefore, a signal of a low logic state is asserted on the output 334 of the logic 328. The signal asserted on the output 334 may not activate the thirteenth transistor 336. Consequently, the first exemplary evaluation logic 302 (e.g., the thirteenth transistor 336 of the first exemplary evaluation logic 302) may not affect the value of the signal (e.g., a high logic state) asserted on the global bit line DOT. In this manner, the first exemplary evaluation logic 302 may cause the global bit line DOT to track the value stored in a node 124 of the cell cell 0.

Because a number of cells 100 coupled to the first and second bit lines bl0, bl1 is reduced compared to conventional memories, the cell 0 may prevent the voltage at the node 126 from changing state while affecting the signal asserted on the first bit line bl0 in the manner described above. For example, because the number of cells 100 coupled to the first and second bit lines bl0, bl1 is reduced compared to conventional memories, an amount of a time that voltage at the node 126 is elevated may be reduced.

Write "0"

To write a value of a low logic state (e.g., a logic "0") to a node 124 of the cell (cell 0), signals illustrated by the third portion 406 of the timing diagram 400 may be applied to and/or coupled to the first exemplary evaluation logic 302. Consequently, the third transistor 308 may be employed to establish a signal of a floating high logic state on the second bit line bl1. Similarly, the fifth transistor 312 may be employed to establish a signal of a high logic state (e.g., $V_{DD}$-Vt, where Vt is the threshold voltage of the fifth transistor 312) on the first bit line bl0. Thereafter, the first and second transistors 304, 306 may affect a value of the signal asserted on the second bit line bl1 such that said signal changes from a high logic state to a low logic state. Further, the fourth transistor 310 may maintain the voltage (e.g., $V_{DD}$-Vt) on the second bit line bl1. Consequently, the voltage at node 124 of the cell (cell 0) is changed to (or refreshed at) a low logic state and the voltage at node 126 of the cell 0 is changed to (or refreshed at) a high logic state. In this manner, a value of a low logic may be written to the node 124 of the cell cell 0.

Write "1"

To write a value of a high logic state (e.g., a logic "1") to a node 124 of the cell (cell 0), signals illustrated by the fourth portion 408 of the timing diagram 400 may be applied to and/or coupled to the first exemplary evaluation logic 302. Consequently, the third transistor 308 may be employed to establish a signal of a floating high logic state on the second bit line bl1. Similarly, the fifth transistor 312 may be employed to establish a signal of a high logic state (e.g., $V_{DD}$-Vt, where Vt is the threshold voltage of the fifth transistor 312) on the first bit line bl0. Thereafter, the fourth transistor 310 may affect a value of the signal asserted on the first bit line bl0 such that said signal changes from a high logic state to a low logic state. Further, the sixth transistor 314 may maintain the value of the signal asserted on the second bit line bl1 at a high logic state. Consequently, the voltage at node 124 of the cell (cell 0) is changed to (or refreshed at) a high logic state and the voltage at node 126 of the cell 0 is changed to (or refreshed at) a low logic state. In this manner, a value of a high logic state may be written to the node 124 of the cell cell 0.

After data is read from and/or written to the cell (cell 0), signals asserted on the first through fourth bit lines bl0-bl3 may established at about $V_{DD}$ using the third, fifth, ninth and eleventh transistors 308, 312, 320 and 324, respectively.

Although operation of the first exemplary evaluation logic 302 to read a value of a low or high logic state and to write a value of a low or high logic state to the cell (cell 0) coupled to the first and second bit lines bl0, bl1 is described above, the first exemplary evaluation logic 302 may be employed to read data from and/or write data to the cell (cell 1) coupled to the third and fourth bit lines bl2, bl3 in a similar manner.

Through use of the system 300 data may be read from and/or written to a cell (e.g., cell 0 or cell 1) in the memory 202 quickly. For example, because a number of cells cell 0, cell 1 (e.g., a load) coupled to a bit line bl0-bl3 of the memory 202 is reduced, a cell from which data is read may affect (e.g., pull down) a state of a bit line bl0-bl3 coupled thereto quickly. In other words, a cell (e.g., cell 0 or cell 1) from which data is read may be coupled to bit lines bl0-bl1, bl2-bl3 which have a reduced number of additional cells 100 coupled thereto, and therefore, the cell (e.g., cell 0 or cell 1) from which data is read may affect the state of a bit on a bit line coupled thereto quickly. As stated, while reading data from the cell (e.g., cell 0 or cell 1), a voltage of a low logic state stored in a node 124, 126 of the cell (e.g., cell 0 or cell 1) may reach an elevated state. However, because the cell (e.g., cell 0 or cell 1) from which data is read may affect a state of a bit line coupled thereto quickly, a time that the voltage at the node 124, 126 is elevated may be reduced and/or minimized (e.g., so that such time is less than a switching time of an inverter 108, 114 included in the cell (e.g., cell 0 or cell 1)). In this manner, a chance that the elevated voltage at the node 124, 126 exceeds a switching voltage of an inverter 108, 114 included in the cell (e.g., cell 0 or cell 1) may be reduced. Therefore, stability of a cell (e.g., cell 0 or cell 1) in the memory 202 may improve.

Further, an amount of chip real estate required by the first exemplary evaluation logic 302 and/or a number of logic devices included in the first exemplary evaluation logic 302 may be reduced and/or minimized. In this manner, the first exemplary evaluation logic 302 may require less circuit overhead. Therefore, the first exemplary evaluation logic 302 may reduce a time required to read data from a cell (e.g., cell 0 or cell 1) in the subset 208. Although, the first exemplary evaluation logic 302 is coupled to the memory 202, the first exemplary evaluation logic 302 may be adapted to couple to a memory having cells 100 arranged in a different manner.

Figure 5:
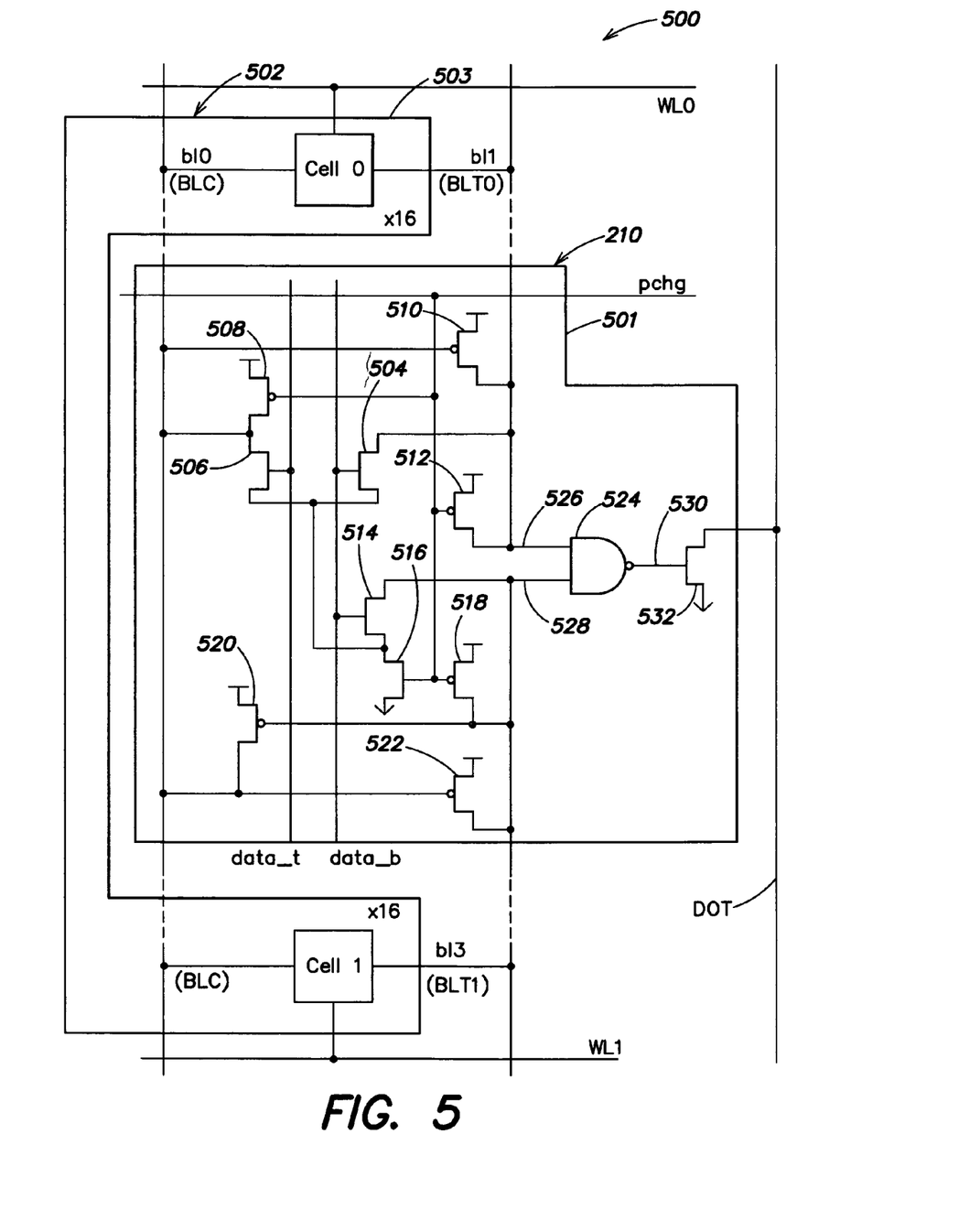
FIG. 5 illustrates second exemplary evaluation logic that may be included in the system for accessing memory in accordance with an embodiment of the present invention.
Figure 6:
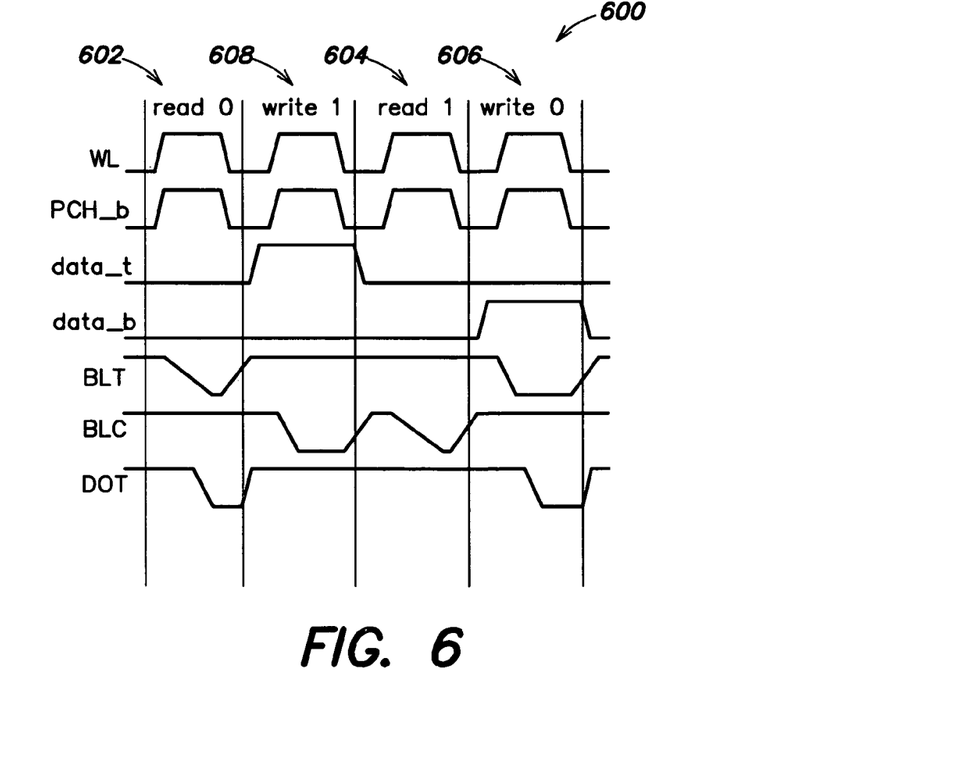
FIG. 6 is a timing diagram illustrating signals applied to the system for accessing memory including the second exemplary evaluation logic in accordance with an embodiment of the present invention.

FIG. 5 illustrates second exemplary evaluation logic that may be included in the system for accessing memory in accordance with an embodiment of the present invention and FIG. 6 is a timing diagram illustrating signals applied to the system for accessing memory including the second exemplary evaluation logic in accordance with an embodiment of the present invention. With reference to FIGS. 5 and 6, the system 500 may include the second exemplary evaluation logic 501 coupled to a portion of a memory 502 similar to the memory 202. More specifically, the second exemplary evaluation logic 501 may be coupled to a subset 503 of the plurality of cells 100 included in the memory 502. The subset 503 may be similar to the subset 208. However, in contrast to subset 208, the at least a second cell (cell 1) may be coupled to the same bit line (e.g., the first bit line bl0) as the at least a first cell (cell 0) rather than the third bit line bl2. Therefore, the first bit line bl0 may serve as the Bit Line Complementary (BLC) for the at least one first cell (cell 0) and the at least one second cell (cell 1). Therefore, in some embodiments, the first bit line bl0 may have thirty-two cells 100 coupled thereto. However, a larger or smaller number of cells 100 may be coupled thereto. Although the number of cells 100 coupled to the first bit line bl0 is still smaller than a number of cells coupled to a bit line in conventional systems.

The second exemplary evaluation logic 501 may include a first transistor 504 (e.g., an NFET) coupled (e.g., via a gate terminal) to a first write line data_b. The first transistor 504 may be coupled (e.g., via a drain or source terminal) to the second bit line bl1, which serves as the Bit Line True (BLT) for the cell (cell 0) in the subset 503. Further, the first transistor 504 may be coupled (e.g., via a source or drain terminal) to a second transistor 506 such as an NFET (e.g., to a source or drain terminal). The second transistor 506 may be coupled (e.g., via a gate terminal) to a second write line data_t, and coupled (e.g., via a drain or source terminal) to a third transistor 508 such as a PFET (e.g., to a source or drain terminal of the third transistor 508). Additionally, the second transistor 506 may be coupled (e.g., via the drain or source terminal) to the first bit line bl0, which serves as the BLC for cells cell 0, cell 1 in the subset 503. The third transistor 508 may be coupled (e.g., via a gate terminal) to a pre-charge line pchg and coupled (e.g., via a drain or source terminal) to a high logic state such as $V_{DD}$.

A fourth transistor (e.g., a PFET) 510 may be coupled (e.g., via a gate terminal) to the first bit line bl0. Further, the fourth transistor 510 may be coupled (e.g., via a drain or source terminal) to a high logic state such as $V_{DD}$ and coupled (e.g., via source or drain terminal) to the first bit line bl1.

The second exemplary evaluation logic 501 may include a fifth transistor (e.g., a PFET) 512 coupled (e.g., via a gate terminal) to the pre-charge line pchg. The fifth transistor 512 may be coupled (e.g., via a drain or source terminal) to a high logic state such as $V_{DD}$ and coupled (e.g., via source or drain terminal) to the first bit line bl1.

Additionally, the second exemplary evaluation logic 501 may include a sixth transistor 514 (e.g., an NFET) coupled (e.g., via a gate terminal) to the first write line data_b, and coupled (e.g., via a drain or source terminal) to a bit line bl3, which serves as the BLT for the cell (cell 1) in the subset 503. The sixth transistor 514 may be coupled (e.g., via a source or drain terminal) to the first and second transistors 504, 506 (e.g., via respective source or drain terminals thereof) and to a seventh transistor 516 such as an NFET (e.g., to a source or drain terminal of the seventh transistor 516). The seventh transistor 516 may be coupled (e.g., via gate terminal) to the pre-charge line pchg and coupled (e.g., via source or drain terminal) to a low logic state such as ground.

The second exemplary evaluation logic 501 may include an eighth transistor 518 (e.g., a PFET) coupled (e.g., via a gate terminal) to the pre-charge line pcg, coupled (e.g., via a drain or source terminal) to a high logic state such as $V_{DD}$, and coupled (e.g., via a source or drain terminal) to the bit line bl3. Further, the second exemplary evaluation logic 501 may include a ninth transistor 520 coupled (e.g., via a gate terminal) to the bit line bl3, coupled (e.g., via a drain or source terminal) to a high logic state such as $V_{DD}$, and coupled (e.g., via source or drain terminal) to the first bit line bl0. Additionally, the second exemplary evaluation logic 502 may include a tenth transistor 522 coupled (e.g., via a gate terminal) to the first bit line bl0, coupled (e.g., via a drain or source terminal) to a high logic state such as $V_{DD}$, and coupled (e.g., via a source or drain terminal) to the bit line bl3.

The second exemplary evaluation logic 501 may include logic 524, such as a NAND gate, a first input 526 of which may be coupled to the second bit line bl1 and a second input 528 of which may be coupled to the bit line bl3. An output 530 of the logic 524 may be coupled to an eleventh transistor 532 (e.g., to a gate terminal of the eleventh transistor 532). The eleventh transistor 532 may be coupled (e.g., via a source or drain terminal) to a low logic state (e.g., ground). Further, the eleventh transistor 532 may be coupled (e.g., via a drain or source terminal) to a global bit line DOT. The second exemplary evaluation logic 501 may be adapted to affect the value of a signal asserted on the global bit line DOT such that said signal tracks the value of data read from a cell (e.g., cell 0 or cell 1) of the subset 503.

A specific arrangement of logic included in the second exemplary evaluation logic 501 is described above. However, the second exemplary evaluation logic 501 may include a larger or smaller amount of logic and/or different logic. Additionally or alternatively, logic included in the second exemplary evaluation logic 501 may be arranged differently.

The operation of the second exemplary evaluation logic 501 is now described. A signal of a high logic state may be asserted on all bit lines bl0, bl1, bl3 coupled to cells cell 0, cell 1 of the subset 503 before reading data from and/or writing data to a selected cell (e.g., cell 0 or cell 1). The timing diagram 600 illustrates signals applied to the second exemplary evaluation logic 501 to read data from and/or write data to a cell (e.g., cell 0 or cell 1) of the subset 503. For example, a first portion 602 of the timing diagram 600 illustrates signals applied to and/or coupled to the second exemplary evaluation logic 501 when a value of a low logic state (e.g., logic "0") is read from a cell (e.g., cell 0 or cell 1), and a second portion 604 of the timing diagram 600 illustrates signals applied to and/or coupled to the second exemplary evaluation logic 501 when a value of a high logic state (e.g., a logic "1") is read from the cell (e.g., cell 0 or cell 1). Similarly, a third portion 606 of the timing diagram 600 illustrates signals applied to and/or coupled to the second exemplary evaluation logic 501 when a value of a low logic state is written to the cell (e.g., cell 0 or cell 1), and a fourth portion 608 of the timing diagram 600 illustrates signals applied to and/or coupled to the second exemplary evaluation logic 501 when a value of a high logic state is written to the cell (e.g., cell 0 or cell 1).

Signals BLC and BLT refer generally to signals asserted on the Bit Line Complementary and Bit Line True, respectively, of a cell to be read from and/or a cell to be written. Similarly, signal WL refers to a signal asserted on the word line wl0, wl1 coupled to the cell to be read from and/or the cell to be written to. Further, signal PCH_b refers to a signal asserted on the pre-charge line pchb.

Read "0"

It is assumed a signal of a high logic state is asserted on the global bit line DOT before reading data from the cell cell 0. To read a value of a low logic state from a node 124 of a cell (cell 0), signals illustrated by the first portion 602 of the timing diagram 600 may be applied to and/or coupled to the second exemplary evaluation logic 501. Consequently, the third transistor 508 may be employed to establish a signal of a high floating logic state on the first bit line bl0. Similarly, the fifth transistor 512 may be employed to establish a signal of a high floating logic state on the second bit line bl1 and the eighth transistor 518 may be employed to establish a signal of a high floating logic state on the bit line bl3. Consequently, a signal of a high logic state may be asserted on the first and second inputs 526, 528 of the logic 524.

However, while reading the value of a low logic state from the node 124 of the cell (cell 0), the fourth and sixth transistors 116, 120 of the cell (cell 0) may affect the value of the signal asserted on the second bit line bl1 such that said signal changes from a high logic state to a low logic state. While affecting the value of said signal, a value (e.g., voltage) at the node 124 may elevate. However, the present methods and apparatus may prevent the elevated voltage from exceeding a switch point of an inverter (e.g., the second inverter 114) included in the cell (cell 0) (e.g., by reducing a time that the voltage at the node 124 is elevated). Because the cell cell0 changes the value asserted on the second bit line bl1 to a low logic state, the value asserted on the first input 526 of the logic 524 changes to a low logic state. Therefore, a signal of a high logic state is asserted on the output 530 of the logic 524. The signal asserted on the output 530 may serve to activate the eleventh transistor 532. Consequently, the second exemplary evaluation logic 501 (e.g., the eleventh transistor 532 of the second exemplary evaluation logic 501) may affect the value of the signal asserted on the global bit line DOT such that said signal changes from a high logic state to a low logic state. In this manner, the second exemplary evaluation circuit 501 may cause the global bit line DOT to track the value stored in a node 124 of the cell cell 0.

Because a number of cells 100 coupled to the first and second bit lines bl0, bl1 is reduced compared to conventional memories, the cell (cell 0) may prevent the voltage at the node 124 from changing state while affecting the signal asserted on the second bit line bl1 in the manner described above. For example, because the number of cells 100 coupled to the first and second bit lines bl0, bl1 is reduced compared to conventional memories, an amount of time that voltage at the node 128 is elevated may be reduced.

Read "1"

As stated, it is assumed a signal of a high logic state is asserted on the global bit line DOT before reading data from the cell cell 0. To read a value of a high logic state from a node 124 of cell 0, signals illustrated by the second portion 602 of the timing diagram 600 may be applied to and/or coupled to the second exemplary evaluation logic 501. Consequently, the third transistor 508 may be employed to establish a signal of a high floating logic state on the first bit line bl0. Similarly, the fifth transistor 512 may be employed to establish a signal of a high floating logic state on the second bit line bl1 and the eighth transistor 518 may be employed to establish a signal of a high floating logic state on the bit line bl3. Consequently, a signal of a high logic state may be asserted on the first and second inputs 526, 528 of the logic 524.

However, to read the value of a high logic state from the node 124 of a cell (cell 0), the first and second transistors 102, 110 of the cell (cell 0) may affect the value of the signal asserted on the first bit line bl0 such that said signal changes from a high logic state to a low logic state. While affecting the value of said signal, the value (e.g., voltage) at a node 126 of the cell (cell 0) may elevate. However, the present methods and apparatus may prevent the elevated voltage from exceeding a switch point of an inverter (e.g., the first inverter 108) included in the cell (cell 0) (e.g., by reducing a time that the voltage at the node 126 is elevated). Therefore, the elevated voltage at the node 126 remains of a low logic state and a value (e.g., voltage) at the node 124 of the cell (cell 0) remains of a high logic state. Consequently, the signal asserted on the second bit line bl1 remains of a high logic state, and therefore, a signal of a low logic state is asserted on the output 530 of the logic 524. The signal asserted on the output 530 may not activate the eleventh transistor 532. Consequently, the second exemplary evaluation logic 501 (e.g., the eleventh transistor 532 of the second exemplary evaluation logic 501) may not affect the value of the signal (e.g., a high logic state) asserted on the global bit line DOT. In this manner, the second exemplary evaluation logic 501 may cause the global bit line DOT to track the value stored in a node 124 of the cell cell 0.

Because a number of cells 100 coupled to the first and second bit lines bl0, bl1 is reduced compared to conventional memories, the cell (cell 0) may prevent the voltage at the node 126 from changing state while affecting the signal asserted on the first bit line bl0 in the manner described above. For example, because the number of cells 100 coupled to the first and second bit lines bl0, bl1 is reduced compared to conventional memories, an amount of a time that voltage at the node 126 is elevated may be reduced.

It should be noted while data is read from the cell (cell 0), the low logic state of the first bit line bl0 may cause the fourth transistor 510 to maintain the high logic state of the signal asserted on the second bit line bl1, thereby providing leakage support.

Write "0"

To write a value of a low logic state (e.g., a logic "0") to a node 124 of the cell (cell 0), signals illustrated by the third portion 606 of the timing diagram 600 may be applied to and/or coupled to the second exemplary evaluation logic 501. Consequently, the third transistor 508 may be employed to establish a signal of a floating high logic state on the first bit line bl0. Similarly, the fifth transistor 512 may be employed to establish a signal of a floating high logic state on the second bit line bl1 and the eighth transistor 518 may be employed to establish a signal of a floating high state on the bit line bl3. However, thereafter, the first and seventh transistors 504, 516 may affect a value of the signal asserted on the second bit line bl1 such that said signal changes from a high logic state to a low logic state. Further, the ninth transistor 520 may maintain a high logic state (e.g., about $V_{DD}$) on the first bit line bl0. Consequently, the voltage at node 124 of the cell (cell 0) is changed to (or refreshed at) a low logic state and the voltage at node 126 of the cell 0 is changed to (or refreshed at) a high logic state. In this manner, a value of a low logic may be written to the node 124 of the cell cell 0.

Write "1"

To write a value of a high logic state (e.g., a logic "1") to a node 124 of the cell (cell 0), signals illustrated by the fourth portion 608 of the timing diagram 600 may be applied to and/or coupled to the second exemplary evaluation logic 501. Consequently, the third transistor 508 may be employed to establish a signal of a floating high logic state on the first bit line bl0. Similarly, the fifth transistor 512 may be employed to establish a signal of a floating high logic state on the second bit line bl1 and the eighth transistor 518 may be employed to establish a signal of a floating high state on the bit line bl3. However, thereafter, the second and seventh transistors 506, 516 may affect a value of the signal asserted on the first bit line bl0 such that said signal changes from a high logic state to a low logic state. Consequently, the fourth transistor 510 may maintain the value of the signal asserted on the second bit line bl1 at a high logic state. Therefore, the voltage at node 124 of the cell (cell 0) is changed to (or refreshed at) a high logic state and the voltage at node 126 of the cell (cell 0) is changed to (or refreshed at) a low logic state. In this manner, a value of a high logic state may be written to the node 124 of the cell cell 0.

After data is read from and/or written to the cell (cell 0), signals asserted on the bit lines bl0, bl1, bl3 may established at about $V_{DD}$ using the third, fifth and eighth transistors 508, 512, 518, respectively.

Although operation of the second exemplary evaluation logic 501 to read a value of a low or high logic state and to write a value of a low or high logic state to the cell (cell 0) coupled to bit lines bl0, bl1 is described above, the second exemplary evaluation logic 501 may be employed to read data from and/or write data to the cell (cell 1) coupled to bit lines bl0, bl3 in a similar manner.

Similar to the system 300, through use of the system 500 data may be read from and/or written to a cell (e.g., cell 0 or cell 1) in the memory 502 quickly. More specifically, because a number of cells cell 0, cell 1 (e.g., a load) coupled to a bit line bl0, bl1, bl3 of the memory 502 is reduced, a cell from which data is read may affect (e.g., pull down) a state of a bit line bl0, bl1, bl3 coupled thereto quickly. In other words, a cell (e.g., cell 0 or cell 1) from which data is read may be coupled to bit lines bl0-bl1, bl0-bl3 which have a reduced number of additional cells 100 coupled thereto, and therefore, the cell (e.g., cell 0 or cell 1) from which data is read may affect the state of a bit on a bit line coupled thereto quickly. As stated, while reading data from the cell (e.g., cell 0 or cell 1), a voltage of a low logic state stored in a node 124, 126 of the cell (e.g., cell 0 or cell 1) may reach an elevated state. However, because the cell (e.g., cell 0 or cell 1) from which data is read may affect a state of a bit line coupled thereto quickly, a time that the voltage at the node 124, 126 is elevated may be reduced and/or minimized (e.g., so that such time is less than a switching time of an inverter 108, 114 included in the cell (e.g., cell 0 or cell 1)). In this manner, a chance that the elevated voltage at the node 124, 126 exceeds a switching voltage of an inverter 108, 114 included in the cell (e.g., cell 0 or cell 1) may be reduced. Therefore, stability of a cell (e.g., cell 0 or cell 1) in the memory 502 may improve.

Further, similar to the first exemplary evaluation logic 302 an amount of chip real estate required by the second exemplary evaluation logic 501 and/or a number of logic devices included in the second exemplary evaluation logic 501 may be reduced and/or minimized. In this manner, the second exemplary evaluation logic 501 may require less circuit overhead. Therefore, the second exemplary evaluation logic 501 may reduce a time required to read data from a cell (e.g., cell 0 or cell 1) in the subset 503. Although, the second exemplary evaluation logic 501 is coupled to the memory 502, the second exemplary evaluation logic 501 may be adapted to couple to a memory having cells 100 arranged in a different manner.

The foregoing description discloses only exemplary embodiments of the invention. Modifications of the above disclosed apparatus and methods which fall within the scope of the invention will be readily apparent to those of ordinary skill in the art. For instance, although the present methods and apparatus describe a system 300, 500 and signals applied and/or coupled thereto in accordance with an embodiment, in other embodiments, the system 300, 500 and/or signals applied and/or coupled thereto may be modified as long as the system continues to reduce an amount of a time that voltage at a cell node is elevated compared to conventional memories.

Accordingly, while the present invention has been disclosed in connection with exemplary embodiments thereof, it should be understood that other embodiments may fall within the spirit and scope of the invention, as defined by the following claims.

The invention claimed is:

1. A method of accessing memory, comprising:
storing a bit in a cell included in a memory having a plurality of cells arranged into rows and columns, wherein each cell includes a group of transistors adapted to both store the bit and affect a signal asserted during a read operation by an evaluation circuit on a bit line coupled to the cell such that the affected signal matches a value of the bit stored in the cell; and
preventing the value of the bit stored in the cell from changing state while the group of transistors affects the signal asserted during the read operation on the bit line coupled to the cell by reducing a load on the bit line with the evaluation circuit.

2. The method of claim 1 wherein reducing a load on the bit line includes reducing a number of cells coupled to the bit line.

3. The method of claim 1 wherein preventing the value of the bit stored in the cell from changing state while the group of transistors affects the signal asserted during the read operation on the bit line coupled to the cell includes reducing an amount of time required to perform the operation on the cell.

4. The method of claim 3 wherein reducing an amount of time required to perform the operation on the cell includes reducing an amount of time that stress that may cause the value of the bit stored in the cell from changing state is placed on the cell.

5. The method of claim 3 wherein reducing an amount of time required to perform the operation on the cell includes performing the operation on the cell before the value of the bit stored in the cell exceeds a voltage that causes an inverter in the cell from changing the state of the bit, wherein the inverter is formed from a subset of transistors in the group of transistors.

6. An apparatus for accessing memory including a plurality of cells, a subset of which includes at least a first cell coupled to a first set of bit lines and at least a second cell coupled to a second set of bit lines, comprising:
evaluation logic coupled to the subset of cells and adapted to perform a read operation on a selected cell in the subset of cells such that a value of a bit stored in the selected cell is prevented from changing state while performing the read operation on the selected cell by reducing a load on the bit line.

7. The apparatus of claim 6 wherein the evaluation logic is further adapted to reduce a load on the bit line by reducing the number of cells coupled on the bit line.

8. The apparatus of claim 6 wherein:
the apparatus is further adapted to reduce an amount of time required to read data perform the read operation on the cell selected to be read.

9. The apparatus of claim 8 wherein the apparatus is further adapted to reduce an amount of time that stress that may cause the value of the bit stored in the cell from changing state is placed on the cell.

10. The apparatus of claim 8 wherein the apparatus is further adapted to read data from the cell selected to be read before the value of the bit stored in the cell exceeds a voltage that causes an inverter included in the cell from changing the state of the bit.

11. The apparatus of claim 10 wherein the apparatus is further adapted to affect the state of a global bit line so that the state of the global bit line tracks the value stored in the cell before said value exceeds a voltage that causes an inverter included in the cell from changing the state of the value.

12. A system for accessing memory, comprising:
a memory having a plurality of cells arranged into rows and columns, wherein each cell includes a group of transistors adapted to both store a bit and affect a signal asserted during a read operation on a bit line coupled to the cell such that the affected signal matches a value of the bit stored in the cell ; and
evaluation logic coupled to the memory and adapted to perform the read operation on each cell and prevent the value of the bit stored in the cell from changing state by reducing a load on the bit line while the group of transistors affects the signal asserted during the read operation on the bit line coupled to the cell.

13. The system of claim 12 wherein the evaluation logic is adapted to reduce a load on the bit line by reducing a number of cells coupled on the bit line.

14. The system of claim 12 wherein the evaluation logic is further adapted to reduce an amount of time required to perform the operation on the cell.

15. The system of claim 14 wherein the evaluation logic is further adapted to reduce an amount of time that stress that may cause the value of the bit stored in the cell from changing state is placed on the cell.

16. The system of claim 14 wherein the evaluation logic is further adapted to perform the operation on the cell before the value of the bit stored in the cell exceeds a voltage that causes an inverter in the cell from changing the state of the bit, wherein the inverter is formed from a subset of transistors in the group of transistors.

* * * * *